(12) United States Patent
Sierak et al.

(10) Patent No.: US 9,082,559 B2
(45) Date of Patent: Jul. 14, 2015

(54) CAPACITIVE SWITCHES

(71) Applicant: Flextronics International Kft., Tab (HU)

(72) Inventors: Thaddaus Sierak, Augsburg (DE); Heinz Hornung, Kirchentellinsfurt (DE); Silvio Richter, Beuren (DE)

(73) Assignee: Flextronics International Kft., Tab (HU)

( * ) Notice: Subject to any disclaimer, the term of this patent is extended or adjusted under 35 U.S.C. 154(b) by 149 days.

(21) Appl. No.: 13/769,114

(22) Filed: Feb. 15, 2013

(65) Prior Publication Data

US 2013/0206569 A1 Aug. 15, 2013

(30) Foreign Application Priority Data

Feb. 15, 2012 (EP) .................................... 12155497

(51) Int. Cl.
| | |
|---|---|
| *H03K 17/975* | (2006.01) |
| *H01H 1/06* | (2006.01) |
| *G06F 3/02* | (2006.01) |
| *G06F 3/01* | (2006.01) |
| *H01H 25/00* | (2006.01) |

(52) U.S. Cl.
CPC ................. *H01H 1/06* (2013.01); *G06F 3/016* (2013.01); *G06F 3/02* (2013.01); *H03K 17/975* (2013.01); *H01H 2025/004* (2013.01)

(58) Field of Classification Search
CPC ........... H01H 1/06; H03K 17/975; G06F 3/02
USPC .......................................................... 200/600
See application file for complete search history.

(56) References Cited

U.S. PATENT DOCUMENTS

| | | | | |
|---|---|---|---|---|
| 6,373,265 | B1 * | 4/2002 | Morimoto et al. ............. | 324/686 |
| 6,933,732 | B2 * | 8/2005 | Morimoto ...................... | 324/661 |
| 6,980,199 | B2 * | 12/2005 | Rekimoto ...................... | 345/169 |
| 7,123,028 | B2 * | 10/2006 | Okada et al. ................... | 324/681 |
| 7,595,712 | B2 * | 9/2009 | Nishino et al. ................. | 335/207 |
| 7,795,553 | B2 * | 9/2010 | Weber et al. ................... | 200/341 |
| 8,274,479 | B2 * | 9/2012 | Prest et al. ..................... | 345/169 |
| 2002/0171439 | A1 * | 11/2002 | Ono .............................. | 324/658 |

OTHER PUBLICATIONS

Bauer et al., DE 102009032614, "Switching element and manual operation . . . ", Jul. 2009, English Machine translation.*

* cited by examiner

*Primary Examiner* — Kyung Lee
(74) *Attorney, Agent, or Firm* — Haverstock & Owens LLP

(57) ABSTRACT

A capacitive switch is comprises a sensor area and with a reference surface in which the sensor surface and the reference surface are configured to produce an electric field (E) between them. The sensor surface and the reference surface are arranged substantially in a common plane such that an electrical field (E) is formed between them with an arched line of force. A coupling surface is configured to move in a plurality of directions in space with respect to the sensor surface and reference surface. A lighting element is configured to illuminate the capacitive switch when activated. A tactile feedback device provides feedback as the capacitive switch is being actuated.

11 Claims, 2 Drawing Sheets

CAPACITIVE SWITCHES

RELATED APPLICATIONS

This Application claims priority under 35 U.S.C. §119(a) through (d) of the European Patent Application No. EP 12 155 497.6 filed Feb. 15, 2012, which is hereby incorporated by reference in its entirety.

FIELD OF THE INVENTION

The invention relates to a capacitive switch. More specifically, an capacitive switch having improved reliability and features over the prior art.

BACKGROUND OF THE INVENTION

Capacitive switches are known from the prior art. A capacitive switch comprises a sensor surface and a reference surface, wherein the sensor surface and the reference surface are formed so that an electric field can be formed between them. An example of such a capacitive switch is described in German Patent No. DE 21 05 071.5, entitled "Capacitive Switch", granted Jan. 29, 1981 to Applicant/Owner Colorado Instruments, Inc. The operating principle of a capacitive switch is that through actuation by a finger press or other contact with the switch surface, the capacitance between the sensor surface and the reference surface changes, which in turn changes other measurable parameters. The measurable parameters are recorded and evaluated and can therefore be used to trigger a desired function. The capacitive switches in the prior art have the disadvantage that the switch point depends on many parameters, and thereby perfectly reliable switching characteristics cannot be ensured. Accordingly, an object of the present invention is therefore to provide a capacitive switch, which has an increased reliability during actuation.

SUMMARY OF THE INVENTION

To solve the above-mentioned object, a capacitive switch with the features of claim 1 is provided, having a sensor surface and a reference surface, wherein the sensor surface and the reference surface are configured to generate an electric field between them. The capacitive switch is characterized in that the sensor surface and the reference surface are substantially in a common plane and are arranged such that an electric field having an arcuate field lines is formed between them. At least one coupling surface is provided, which is arranged in the electric field and causes a change in capacitance between the sensor surface and the reference surface when a coupling surface relative is moved relative to the sensor surface and the reference surface. The reference surface of the capacitive switch can be connected to a ground potential, while the sensor surface may be connected to an electrical supply line. An essential point of the invention lies in the fact that by the arrangement of the sensor surface and the reference surface is substantially in a common plane and the provision of an additional coupling surface in the region of the electric field between the sensor surface and the reference surface is of a higher reliability than the prior art. Moreover, the capacitive switch of the presently claimed invention is less sensitive in terms of electromagnetic disturbances (EMC). Particularly preferred is a capacitive switch in which the coupling surface in movable in several spatial directions, relative to the sensor surface and the reference surface. Preferably it is provided that the movement of the coupling surface is limited mechanically. Preferably, the coupling surface can be displaced between at least two defined positions, and is able to occupy these positions. For this purpose, the coupling surface is formed integrally with an actuating element for displacing the coupling surface together. The actuating element is preferably made of a non-conductive material, to prevent a finger or hand from that is actuating the capacitive switch from changing the capacitive coupling between the coupling surface, reference surface, and sensor surface. A tactile feedback means is provided for generating a reference acoustic communication, preferably not in one of the at least two stable positions of the coupling surface. The tactile feedback device can be designed with the coupling surface in a single component. Particularly preferred is an embodiment in which the tactile feedback means is formed integrally with one of the coupling and the actuating element. In particular, the tactile feedback device causes a snapping of the coupling surface, which generates the communication information for a user of the capacitive switch, that a defined position is reached. The invention is explained in more detail with reference to the drawing.

DETAILED DESCRIPTION OF THE DRAWINGS

Figure 1:
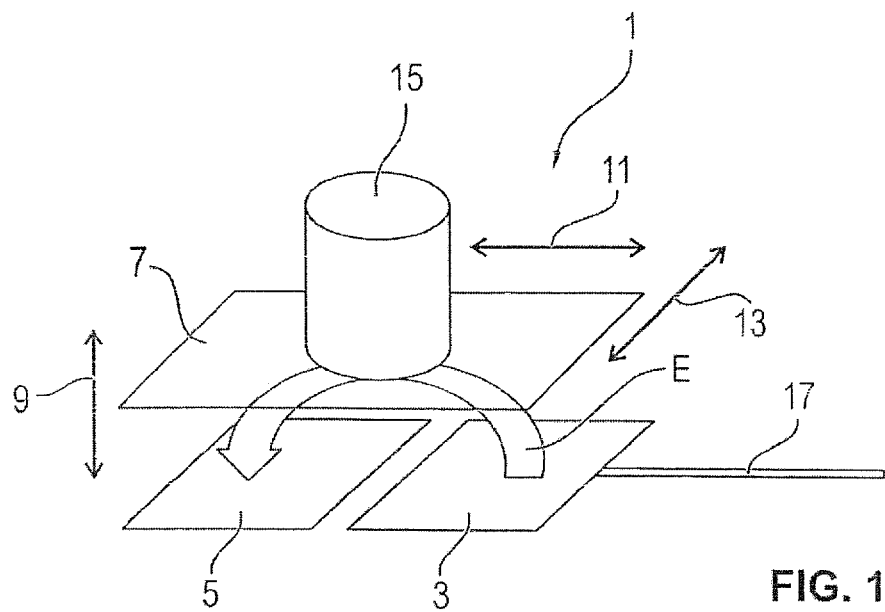
FIG. 1 shows a schematic representation of a capacitive switch in accordance with the invention.

FIG. 1 shows a schematic representation of a capacitive switch 1 according to the invention. The capacitive switch 1 comprises a sensor surface 3, a reference surface 5 and a coupling surface 7. The coupling surface 7 is preferably movable in several directions in space, as indicated by the arrows 9, 11, and 13 in the FIG. 1. The coupling surface 7 is coupled to an actuating element 15, wherein the actuating element 15 is preferably made of a nonconductive material. The sensor surface 3, and the reference surface 5 are arranged substantially in a common plane. The reference surface 5 is preferably coupled to a ground terminal (GND), while the sensor surface 3 is coupled to an energy source (not shown) via an electrical supply line 17. During operation of the capacitive switch, an electric field, E, is formed between the sensor surface 3 and the reference surface 5. The electric field E has field lines that extend arcuate or in a circular arc between the sensor surface 3 and the reference surface 5. The coupling surface 7 is arranged in the region of the electric field, E. The operation of the capacitive switch 1 is such that during a displacement of the coupling surface 7 in the electric field, E, between the reference surface 5 and the sensor surface 3, a change in the capacitance between the sensor surface 3 and the reference surface 5 is effected. This capacitive change can be detected by an appropriate electrical circuit that is configured to trigger a desired function. The sensor surface 3 and the reference surface 5 are thus coupled by means of the capacitive coupling surface 7. The preferred direction of movement of the coupling surface 7 is associated with the movement direction indicated by arrow 9, wherein the coupling surface 7 is moved toward or away from the sensor surface 3 and the reference surface 5. To obtain an increased reliability of the capacitive switch, according to the invention, the coupling surface 7 is displaced between two or more stable, or defined, positions. These defined positions of the coupling face 7 have a fixed capacitance between the sensor surface 3 and reference surface 5, so that in each defined position a known capacitance is present between the reference surface 5 and the sensor surface 3. Only a corresponding desired movement of the actuator 15 between the two defined positions triggers the switching operation. Furthermore, a tactile feedback device may be provided which has an undefined movement of the actuator 15 and thus the coupling avoids the coupling surface 7. For example, a bi-material in the form of a metal snap disc, a silicone mat, a squib of plastic, etc. is provided. A shift in the coupling surface 7 into the second defined position occurs only when the compressive force on the actuating element 15 exceeds the trigger point of tactile feedback element. By appropriate mechanical design and choice of materials, the characteristic of the compressive force and the trigger point can be adjusted as desired.

Figure 2:
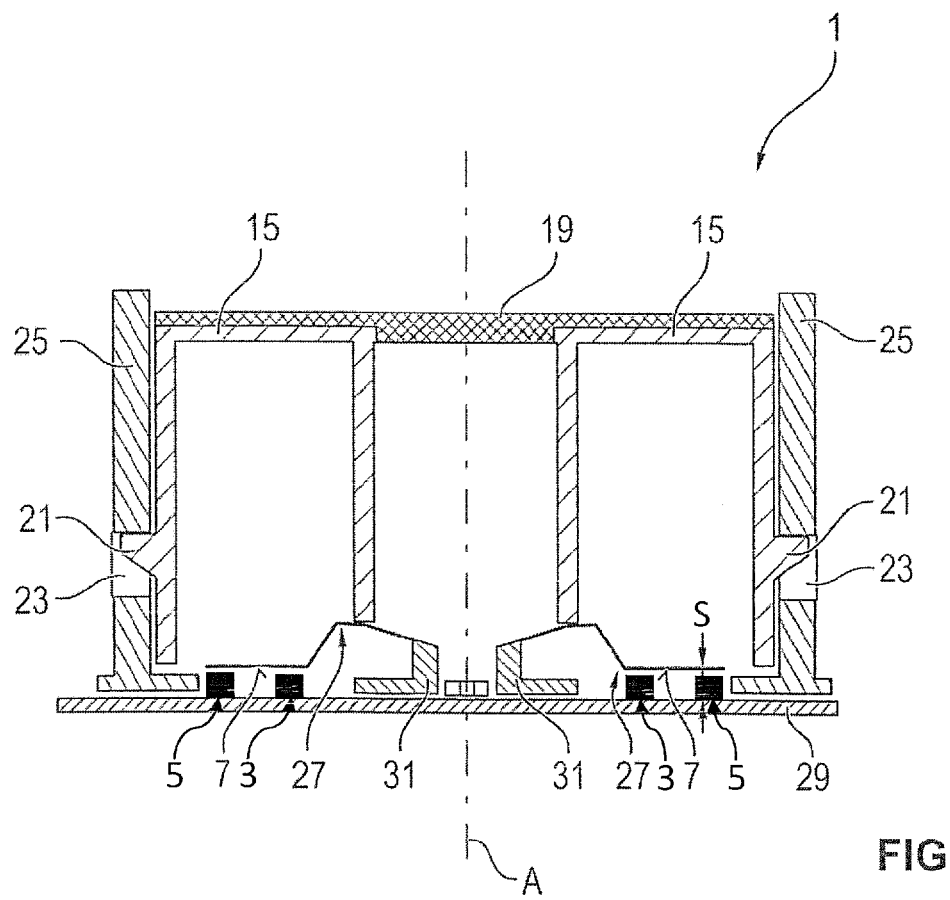
FIG. 2 shows a schematic sectional view of a first embodiment shape of the capacitive switch according to the invention in a first defined position.

In FIG. 2 an embodiment of a capacitive switch is shown. In FIG. 2, the capacitive switch 1 is formed with a double cylindrical actuating element 15 with a cover 19. The cover 19 comprises a contact surface for actuation by a finger. The cover 19 also can comprise a printing surface for graphics or text describing the function of the capacitive switch 1. The actuating element 15 includes a radial projection 21 that engages in an annular recess 23 of a cylindrical housing 25. The actuating element 15 moves along a central axis A of the cylindrical housing 25. The actuating element 15 cooperates with a disc-shaped movable element 27, which is disposed between a circuit board 29 and the actuating element 15 in the cylindrical housing 25. The movable element includes a coupling surface 7 on a side facing the circuit board 29. The movable element 27 is movably mounted on the printed circuit board 29 by a supporting element 31 on the circuit board 29, the sensor surface 3, and the reference surface 5 are arranged, which preferably extend in a coaxial arrangement around the central axis A.

Figure 3:
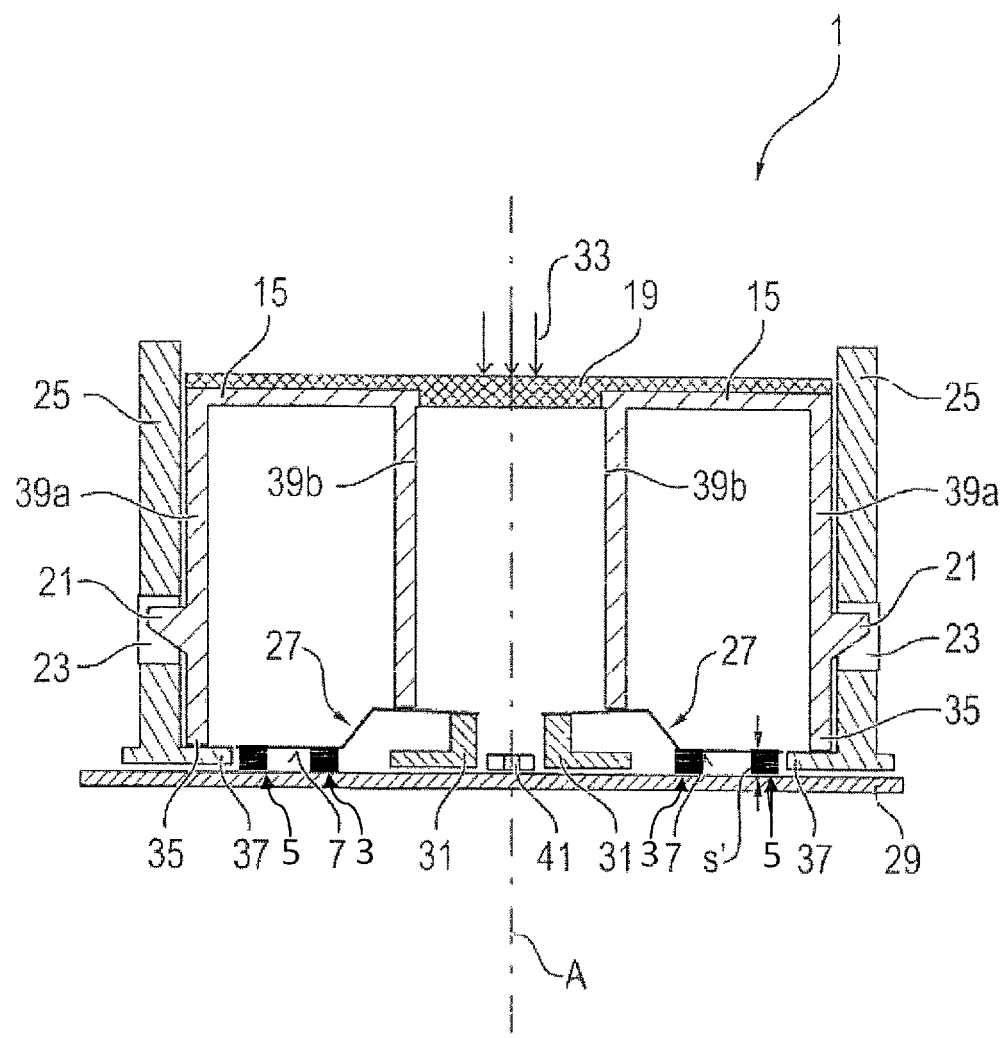
FIG. 3 shows the capacitive switch of FIG. 2 in a second defined position.

In the switching position according to FIG. 2, the capacitive switch 1 is not operated, i.e., the actuating element 15 is not pressed. Therefore the actuating element 15 is in the switching position in which the radial projection 21 abuts against the cylindrical housing 25, facing away from the end of the annular groove 23. In this first defined position, the coupling surface 7 has a distance, S, to the circuit board 29 such that the coupling element 7 is not in contact with the sensor surface 3 and is not in contact with the reference surface 5. In FIG. 3, the capacitive switch 1 according to the embodiment of FIG. 2 is in second defined position. The same parts are provided with the same reference numbers, as described above.

In the second defined position shown in FIG. 3, a force on the actuating element 15 is so exercised that the radial projection 21 of the actuating element 15 is not contacting with the cylindrical housing 25 and is, instead, positioned within the annular groove 23 as a result of an actuating force, 33, upon the cover 19 and therefore upon the actuating element 15. The actuating member 15 can be displaced so far into the cylindrical housing 25 until an end 35 of the actuating member 15 contacts a stop member 37 of the housing 25. The stop member 37 is preferably located immediately adjacent to the circuit board 29 and in particular preferably rests on the circuit board 29. The stop element 37 shown in FIG. 3 is formed integrally with the cylindrical housing 25. Basically, it is also conceivable that the circuit board 29 can function as a stop element 37 to limit stroke of the actuating element 15. By the displacement of the actuating element 15 in the direction of the arrows 33, there is a corresponding shift of the movable member 27 and thus a displacement of the coupling surface 7 in the direction of the arrows 33, in the direction of the circuit board 29. The displacement of the movable member 27 results in a reduced distance S' between the coupling surface 7, and the reference surface 5 and of the sensor surface 3, which leads to a change in capacitance between the reference surface 5 and the sensor surface 3. The capacitance between the reference surface 5 and the sensor surface 3 is uniquely determined by the second defined position shown in FIG. 3. The second defined position of the actuating element 15 is determined by an end 35 of an outer cylinder 39a of the actuating element 15. The end 35 contacts the stop element 37 at a height S' above the surface of the circuit board 29 that also defines a distance of the coupling surface 7 to the reference surface 5 and the sensor surface 3. The movable member 27 is preferably formed as a ring around the longitudinal axis A of the cylindrical housing 25. Preferably the movable member 27 is spring-mounted and connected in a suitably biased state with a support element 31, such that, after a release of the actuating element 15, the first defined position shown in FIG. 2 is automatically obtained. An inner cylinder 39b of the actuating element 15 rests upon the movable member 27 and deflects the movable member 27 in response to a force 33 upon the cover 19 of the capacitive switch 1 to effect the second defined position of FIG. 3, aiding in the movement of the coupling surface 7 toward the reference surface 5 and the sensor surface 3. In a cylindrical opening of the supporting element 31, a light element 41 can be provided. A light element can be an LED or the like other lighting means. For example, it is conceivable that the cover 19 can be translucent in form, so that upon actuation of the capacitive switch 1, i.e., the actuating element 15 is depressed in the direction of the arrows 33, a current flow to the light element 41 is caused, thereby illuminating the cover 19 when the capacitive switch 1 is activated by being in the second defined position shown in FIG. 3. The inner cylinder 39b also directs light from the lighting element 41 onto the cover 19. The inner cylinder 39b also provides a portion of the tactile feedback when the actuating element 15 is depressed. It is understood that instead of a cylindrical configuration of the switching element a cuboid structure, or the like can be used. The actuating element 15 according to the present invention may thus comprise a dual function of displaying the coupling service to actuate the capacitive switch 1 and providing a tactile feedback means when an operator actuates the switch. Note that communication is preferably not acoustic. Overall, therefore, that the present invention provides an advantageous capacitive switch, having an increased switch reliability.

REFERENCE LIST

1 Capacitive switch
3 Sensor surface
5 Reference surface
7 Coupling surface
9 Arrow
11 Arrow
13 Arrow
15 Actuating element
17 Electrical lead
19 Cover
21 Radial projection
23 Annular groove
25 Cylindrical housing
27 Movable element
29 Circuit board
31 Support element
33 Directional arrow 35 End
37 Stop element
39a Radially outer cylindrical section
39b Radially inner cylindrical section
Lighting element
E Electric field
A Longitudinal/center axis
S Distance
S' Distance

What is claimed is:

1. A capacitive switch having a sensor surface and a reference surface, wherein the sensor surface and the reference surface are adapted to generate an electric field between them, characterized in that the sensor surface and the reference surface are arranged substantially in a common plane such that the electric field is formed with arcuate field lines between the sensor surface and the reference surface, and further comprising at least one coupling surface arranged in the electric field and having a movement relative to the sensor surface and the reference surface that causes a change in capacitance between the sensor surface and the reference surface, wherein the coupling surface is moved between a non-actuated position and an actuated position such that when in the non-actuated position the coupling surface is physically separated from the sensor surface and the reference surface.

2. The capacitive switch of claim 1 characterized in that the coupling surface is movable in a plurality of directions in space with respect to the sensor surface and the reference surface.

3. The capacitive switch of claim 1 characterized in that the movement of the coupling surface is mechanically limited.

4. The capacitive switch of claim 1, characterized in that the coupling surface can assume at least two stable positions.

5. The capacitive switch of claim 1, characterized in that the coupling surface is coupled to an actuating element configured to displace the coupling surface.

6. The capacitive switch of claim 5, characterized in that the actuating element consists of a non-conductive material.

7. The capacitive switch of claim 1, further comprising a tactile feedback device configured to generate a reference acoustic communication at a third position of the coupling surface.

8. The capacitive switch of claim 7, characterized in that the tactile feedback device is integrally formed with the coupling surface.

9. The capacitive switch of claim 7, characterized in the that the tactile feedback device is formed integrally with the actuating element.

10. The capacitive switch of claim 7, characterized in that the tactile feedback device comprises snapping one of the at least one coupling surfaces.

11. The capacitive switch of claim 1, wherein the reference surface is coupled to a ground potential.

* * * * *